United States Patent [19]

Tsai

[11] Patent Number: 5,812,473
[45] Date of Patent: Sep. 22, 1998

[54] SYNCHRONOUS DRAM WITH ALTERNATED DATA LINE SENSING

[75] Inventor: Terry Tsai, Sunnyvale, Calif.

[73] Assignee: Perfectron, Inc., San Jose, Calif.

[21] Appl. No.: 746,655

[22] Filed: Nov. 13, 1996

[51] Int. Cl.$^6$ .................................................. G11C 7/00
[52] U.S. Cl. .......................... 365/205; 365/208; 365/190
[58] Field of Search ..................................... 365/205, 190, 365/207, 208, 63

[56] References Cited

U.S. PATENT DOCUMENTS

| | | | |
|---|---|---|---|
| 5,367,492 | 11/1994 | Kawamoto | 365/190 |
| 5,544,125 | 8/1996 | Yokoyama | 365/230.06 |
| 5,594,704 | 1/1997 | Konishi | 365/203 |

OTHER PUBLICATIONS

Yunho Choi et al., "16–Mb Synchronous DRAM with 125–Mbyte/s Data Rate", *IEEE Journal of Solid–State Circuits*, 29(4) 529–531 (Apr. 1994).

Natsuki Kushiyama et al., "A 500–Megabyte/s Data–Rate 4.5M DRAM", *IEEE Journal of Solid–State Circuits*, 28(4) 490–491 (Apr. 1993).

Toshio Sunga et al., "A Full Bit Prefetch Architecture for Synchronous DRAM's", *IEEE Journal of Solid–State Circuits* 30(9) 998–999 (Sep. 1995).

Toshio Sunaga, "A Full Bit Prefetch DRAM Sensing Circuits", *IEEE Journal of Solid–State Circuits*, 31(6) 767–768 (Jun. 1996).

Yasuhiro Takai et al., "250 Mbyte/s Synchronous DRAM Using a 3–Stage–Pipelined Archnitecture", *IEEE Journal of Solid–State Circuits*, 29(4) 426–427 (Apr. 19, 1994).

*Primary Examiner*—A. Zarabian
*Attorney, Agent, or Firm*—Townsend & Townsend & Crew LLP; Henry K. Woodward

[57] ABSTRACT

A synchronous dynamic random access memory (SDRAM) has a plurality of memory cell arrays including a plurality of bit line pairs with each bit line connected to a plurality of memory cells, a plurality of sense amplifiers with each sense amplifier connected to a bit line pair of each memory cell array through a bank select switch, and a plurality of data line pairs. A plurality of pass gates includes a first pair of pass gates connecting a sense amplifier output of a bit line pair to a first data line pair, and a second pair of pass gates connecting the sense amplifier output of a bit line pair to a second data line pair, whereby each bit line pair is connectable through a sense amplifier to first and second data line pairs. In operation, the first data line pair and the second data line pair are toggled alternately in connection to the bit line pairs by alternating column select line signals (CSLA, CSLB).

10 Claims, 6 Drawing Sheets

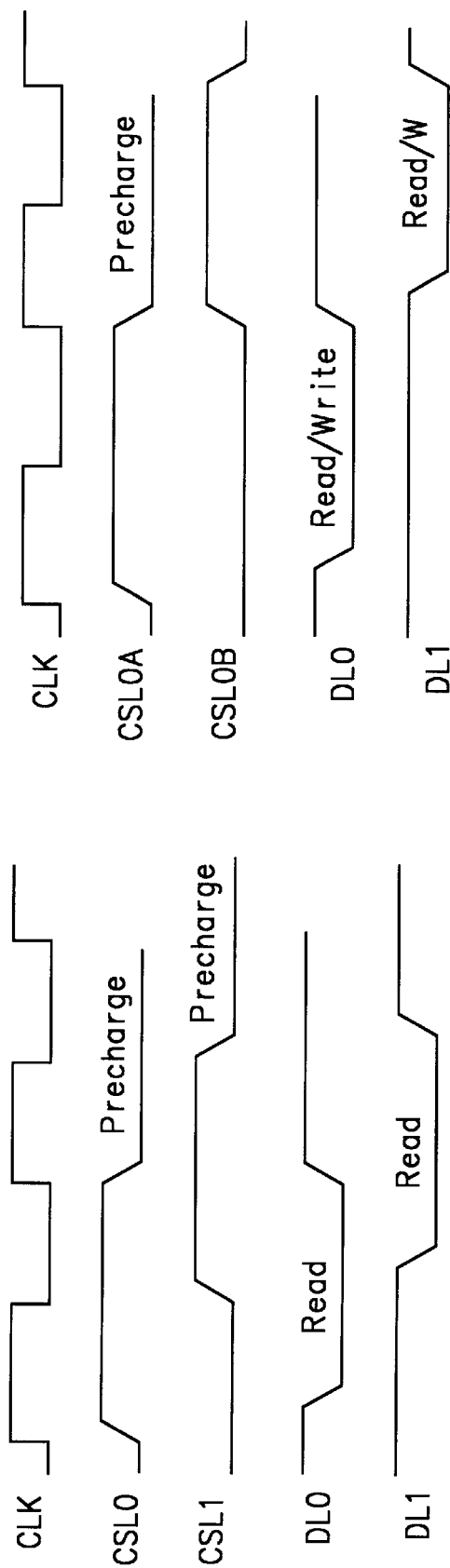

SYNCHRONOUS DRAM WITH ALTERNATED DATA LINE SENSING

BACKGROUND OF THE INVENTION

This invention relates generally to dynamic random access memories (DRAMs), and more particularly the invention relates to a synchronous dynamic random access memory (SDRAM) with alternated data line Read/Write (R/W).

The DRAM is employed widely for the main memory in modern electronic systems due to a small cell size and ease of use. However, as the microprocessor and microcontroller have become faster and more powerful, the DRAM has lagged behind in speed of operation, and the speed gap increases for every new generation of microprocessor. Memory speed has limited the overall system performance.

To solve this problem, the synchronous DRAM has been proposed for speed enhancement and cost effectiveness. Proposed architectures include a pipeline architecture, a two bit prefetch data path design, and an eight-bit full bit prefetch architecture. All of these approaches offer enhanced memory speed but have their own drawbacks. The pipeline architecture is straightforward but consumes more power as frequency increases and has less process margin for data line R/W and precharging time. The two-bit prefetch design consumes less power and has ample R/W precharge time, but it does not accept column address change at every clock cycle. Rather, it has to follow a unique $2^N$ rule. The column address can only be changed at every other cycle. The eight-bit prefetch architecture offers low power and high speed but at the expense of higher semiconductor die cost. The full bit prefetch architecture can overcome the aforementioned drawbacks, however, its structure is limited to the trench-type cell design which is generally considered as more demanding in process requirements and is more prone to process defects.

SUMMARY OF THE INVENTION

In accordance with the present invention a synchronous dynamic random access memory comprises a memory cell array having a plurality of bit line pairs with each bit line connected to a plurality of memory cells, and a plurality of sense amplifiers with each sense amplifier connected to a bit line pair of the memory cell array through a column select switch. A plurality of data line pairs are provided along with a plurality of pass gates with a first pair of gates connecting a sense amplifier output of a bit line pair to a first data line pair and a second pair of gates connecting the sense amplifier output of the bit line pair to a second data line pair. Thus, each bit line pair is connectable through a sense amplifier to either first or second data line pairs. The pass gate connected to a first data line pair and a second data line pair are toggled by alternating column select line signals (CSLA, CSLB).

In a preferred embodiment the DRAM includes a plurality of memory cell arrays, and each sense amplifier is connectable to a bit line pair in two memory cell arrays.

In accordance with preferred embodiments of the invention, the plurality of data line pairs can include two, four, or more data line pairs to facilitate speed and flexibility of operation.

The invention and objects and pictures thereof will be more readily apparent from the following detailed description and appended claims when taken with the drawings.

BRIEF DESCRIPTION OF THE DRAWINGS

FIG. 4 illustrates signal wave forms in the architecture of FIG. 3.

FIG. 6 illustrates signal wave forms in the architectures of FIGS. 5A, 5B.

DETAILED DESCRIPTION OF ILLUSTRATED EMBODIMENTS

Figure 1A:
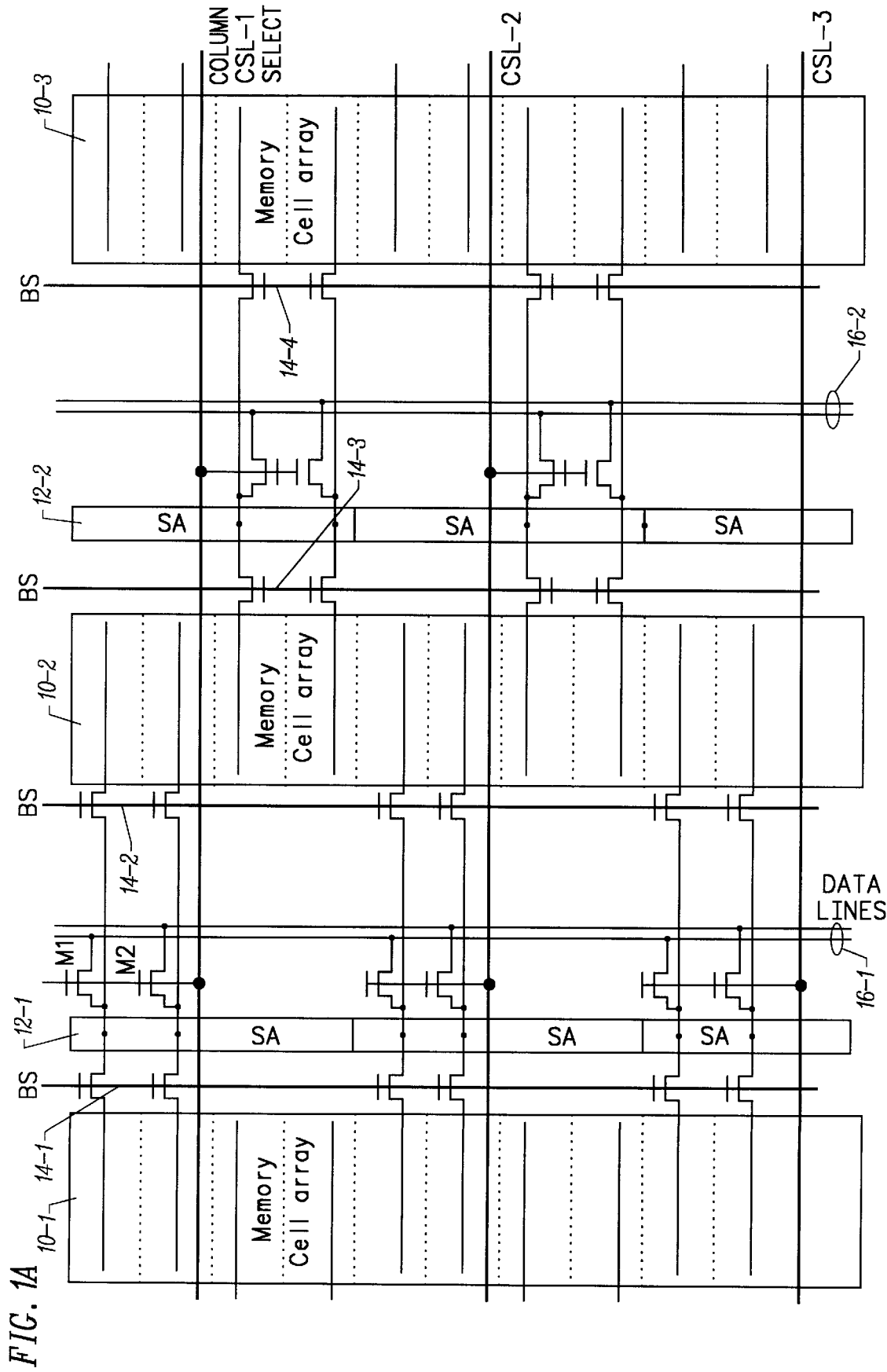
FIGS. 1A and 1B are schematics of a conventional SDRAM including a plurality of memory cell arrays, sense amplifiers, and data line pairs.
Figure 1B:
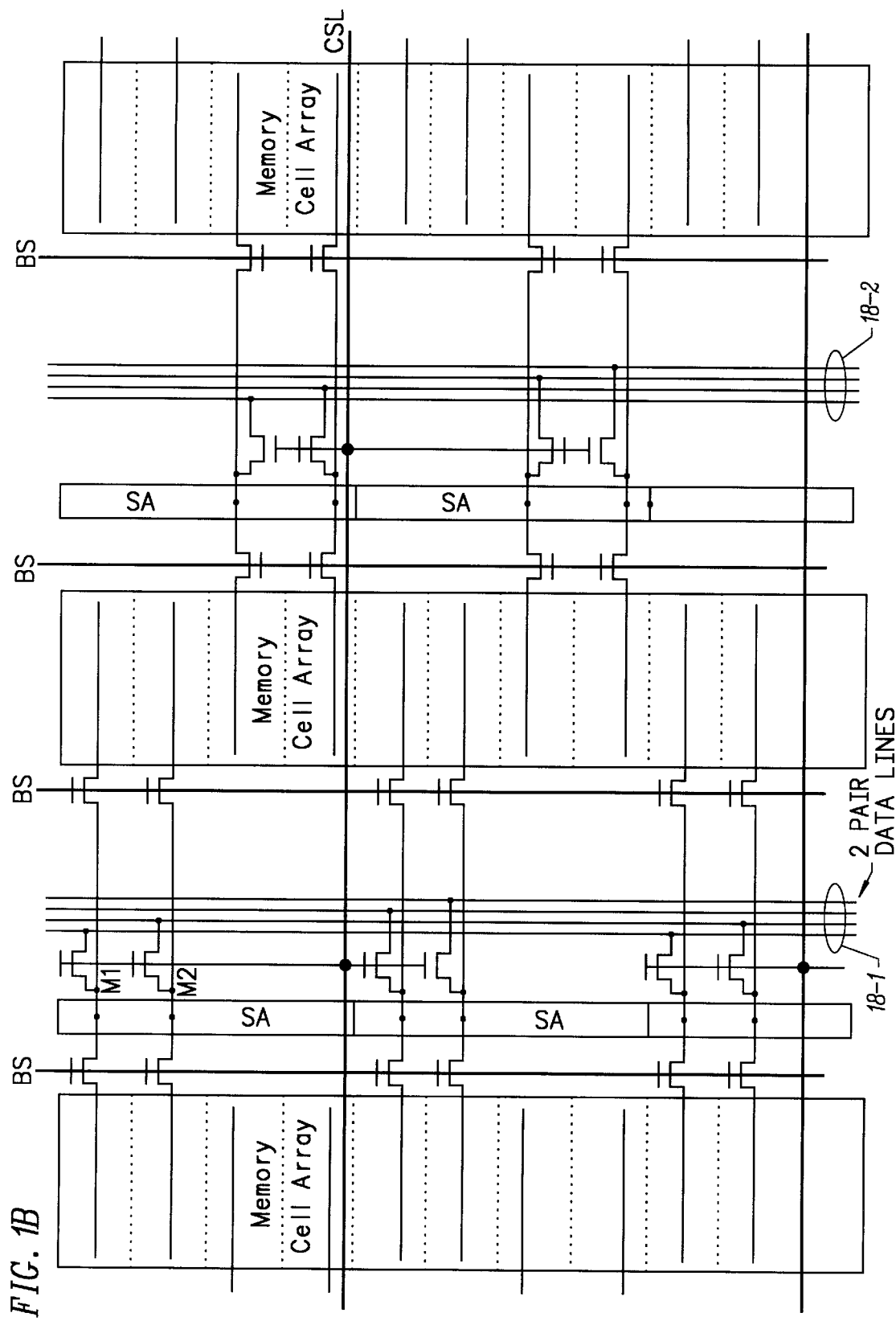
Figure 2:
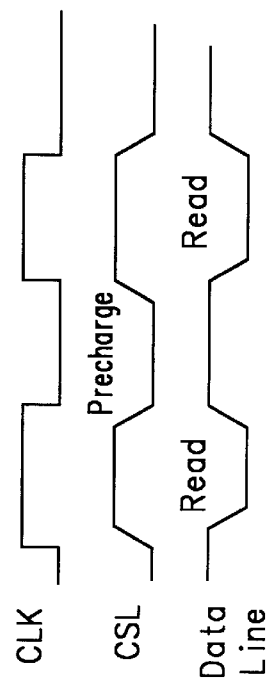
FIG. 2 illustrates wave forms in the memories of FIGS. 1A, 1B.

FIGS. 1A and 1B illustrate conventional DRAM architectures in which a plurality of memory cell arrays 10-1, 10-2, and 10-3 have a plurality of bit lines organized in rows and connected to sense amplifiers 12-1 and 12-2 through column select transistor pairs M1, M2, M3, and M4, which are controlled by column select lines CSL-1, CSL-2, and CSL-3. Transistors 14-1, 14-2, 14-3 and 14-4 connect memory cells to the sense amplifiers and are controlled by Bank Select (BS). In FIG. 1A each sense amplifier array has one pair of data lines 16-1, 16-2, while FIG. 1B shows an alternative implementation in which two pairs of data lines 18-1, 18-2 are provided for each memory cell array. In both embodiments, each sense amplifier is shared by two memory cell arrays and is connected to the data lines by pass gates M1, M2 which are gated by the column select line CSL. Each column select line (CSL) controls one sense amplifier per sense amplifier array, thus each sense amplifier serves one data line pair. In FIG. 1B each CSL controls two sense amplifiers per sense amplifier bank with the sense amplifier divided into two groups; each group serving one data line pair. Thus, each bit line pair is connected through the local sense amplifier to one data line pair. The wave forms for the two architectures of 1A, 1B are illustrated in FIG. 2.

Figure 3:
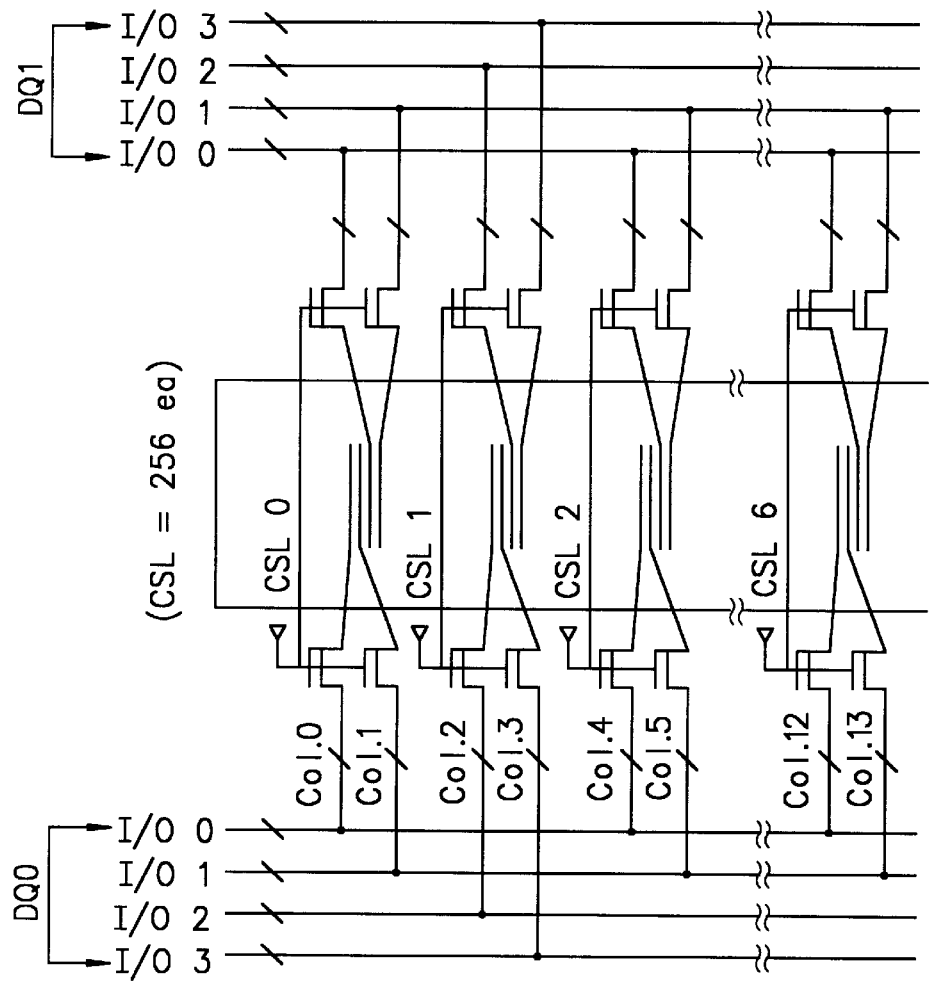
FIG. 3 is a schematic illustrating a two bit prefetch SDRAM architecture in accordance with the prior art.

FIG. 3 illustrates a prior art two-bit prefetch architecture which differs from the architecture of FIG. 1B by having two groups of column select lines (CSL), each group controlling a data line pair. Hence, by staggering the activation cycles of the two groups of CSL, the data line sense/precharge time can be lengthened to allow data developing into a full CMOS level. Wave forms in this architecture are illustrated in FIG. 4.

In the two bit prefetch architecture there are two sets of data lines which are connected to odd or even bit line pairs. These two sets of data lines allow two bits of data to be latched in parallel at sense amplifiers. Data can then be read out serially at full clock speed. Further, while one set of data lines is used for read or write, the other set of data lines is used for precharge. This architecture allows almost twice the margin read (or write) and precharge for the same clock rate as the pipeline architecture. Therefore, it can easily achieve clock frequencies above 100 MHz. However, the odd and even bit line pairs are assigned to one of the two sets of data lines, and it becomes problematic when an attempt is made to interrupt a first sequence with a new selected bit line pair which happens to connect to the same set of lines as that of the previous bit line pair. This imposes a $2^N$ rule which restricts the random column select to every other cycle.

The present invention provides a new architecture to overcome the $2^N$ rule restriction while still preserving the simplicity and effectiveness of two-bit prefetch architecture.

Figure 5A:
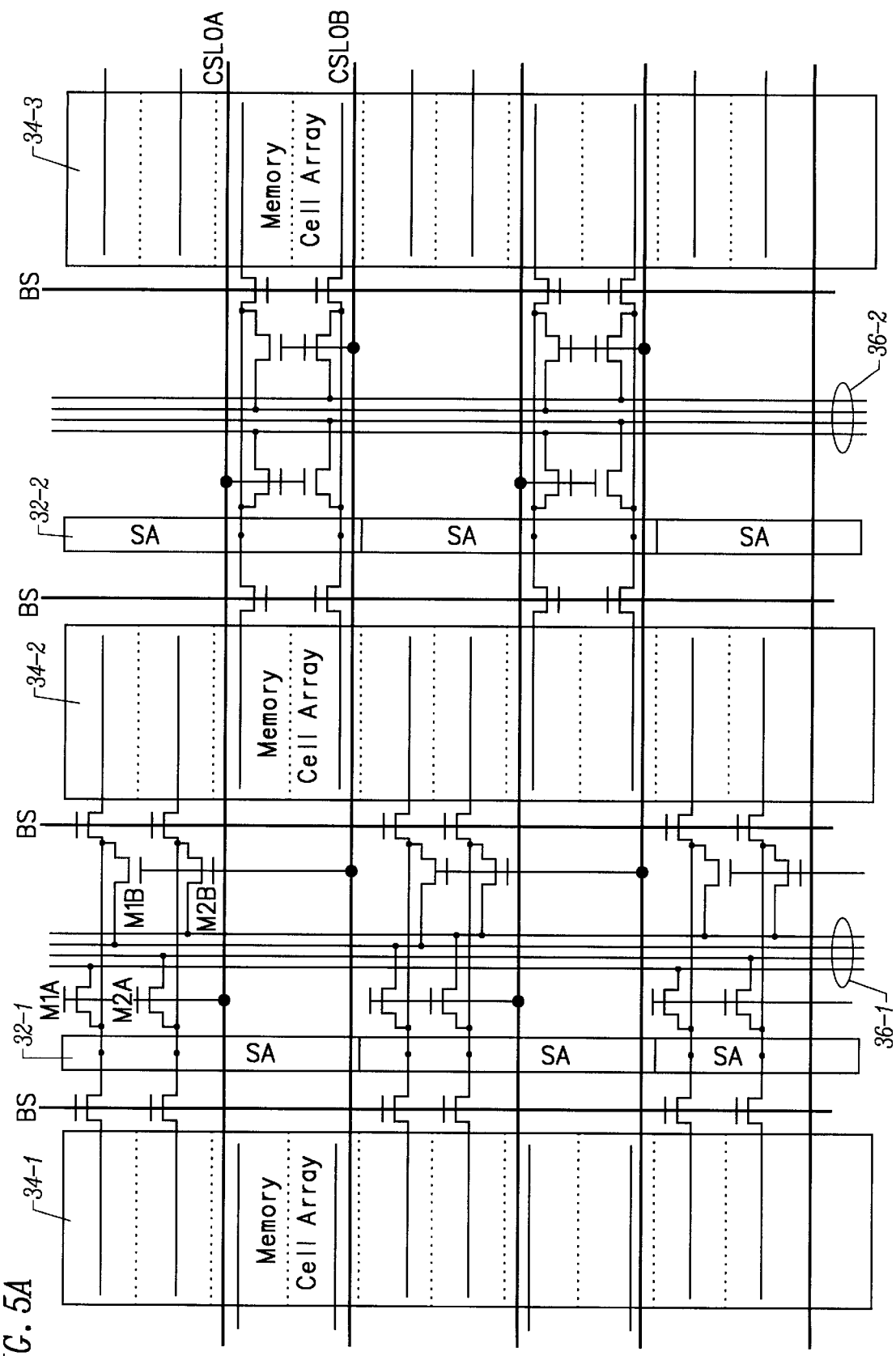
FIGS. 5A and 5B are schematics illustrating an SDRAM in which each bit line pair is connectable through its sense amplifier to a plurality of data line pairs in accordance with embodiments of the invention.
Figure 5B:
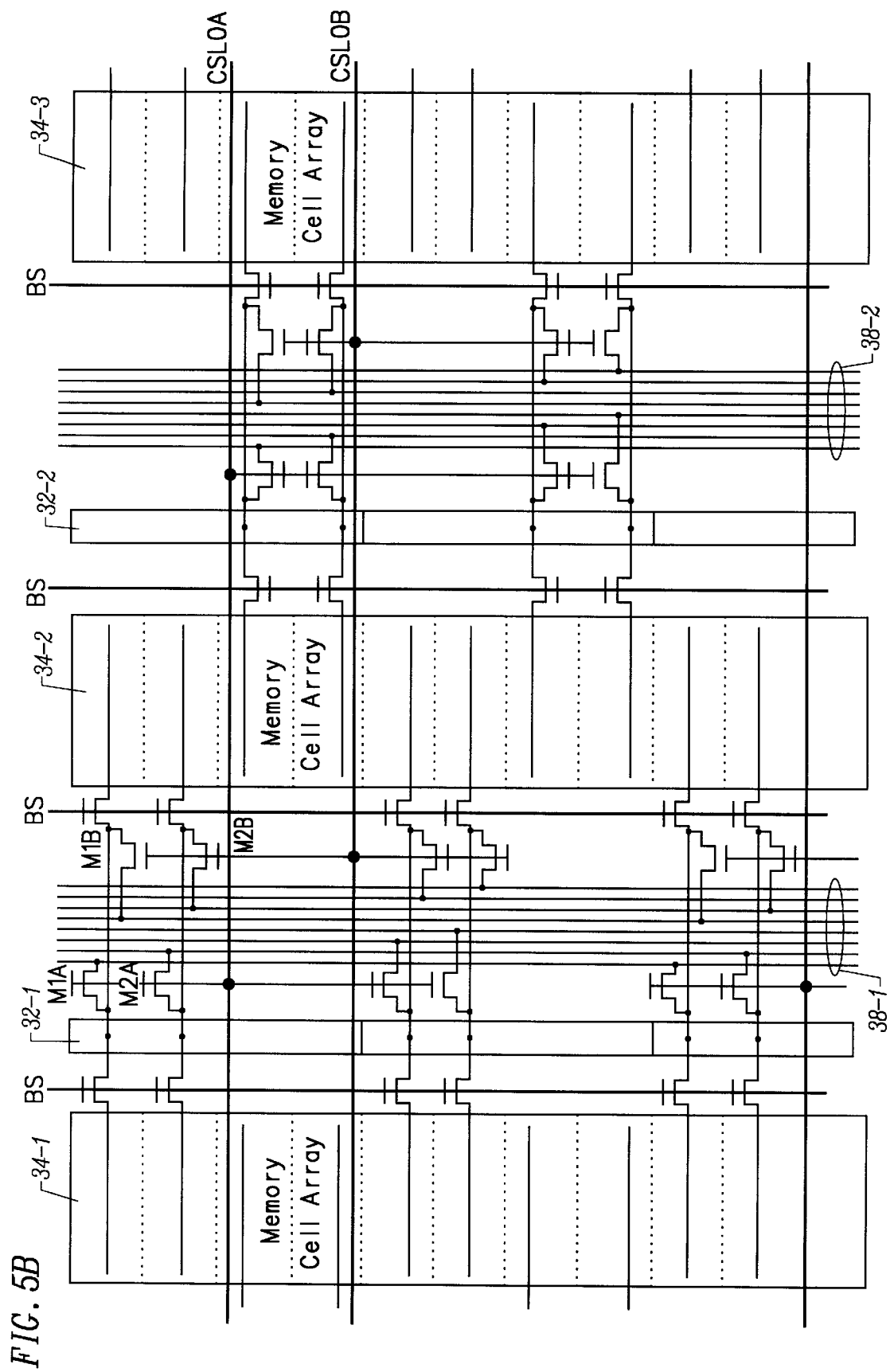

FIGS. 5A and 5B are schematics of SDRAM architectures in accordance with embodiments of the invention. The architecture includes three memory cell arrays, 34-1, 34-2, 34-3, with arrays of sense amplifiers 32-1, 32-2 positioned between the memory cells arrays. In FIG. 5A, the two pairs of data lines as illustrated in 36-1 or 36-2 are perpendicular to the multiple bit line pairs. Each bit line pair is connected not to just one of the data line pairs but to both of the pairs through pass gates M1A, M2A and M1B, M2B. The array of FIG. 5B is similar to the memory of FIG. 5A but four pairs of data lines 38-1, 38-2 are provided for each array of sense amplifiers. Thus, each bit line pair is not dedicated to any one set of data lines, but can be routed alternatively between two data line pairs by the selection of CSL switch at a given time. Any new bit line pair can access to the data line which is not being used by the previous bit line pair through column select and a data line toggle control. The toggle control monitors which set of data lines has been used and assigns the other data line pair with the next bit line access. This method preserves all of the merits of the two bit prefetch architecture such as ample margin for precharge data lines and running with lower power consumption. However, its flexibility provides for an interrupt of a burst sequence in both read and write at every clock cycle.

In the prior art design of FIGS. 1A, 1B, one column select line (usually metal two) controls every two bit line pair (FIG. 1A) or every four bit line pair (FIG. 1B) in the bit line direction. The additional column select line in accordance with the invention can easily be accommodated without wasting any space. The additional set of data lines (usually metal one) can be laid out over the same space as the extra column select switches to minimize the space requirements. The effective space requirement is almost the same as a typical two bit prefetch architecture but without the $2^N$ rules restriction.

In FIGS. 5A, 5B, the alternated data line sensing differs from the prior art schemes by having two pass gate pairs for each sense amplifier. The pass gate pairs are gated by CSLA and CSLB which come from the column select control and are toggled alternately. Each sense amplifier serves two data line pairs, and by alternating CSLA and CSLB, the data line R/W precharge time is doubled. Flexibility of the circuits also allow an interrupt even in burst mode every clock cycle. The signal sense wave forms are shown in FIG. 6.

There has been described as synchronous DRAM with alternated data line sensing in which each pair of bit lines is connectable to a plurality of data line pairs for added flexibility and operation. While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A synchronous dynamic random access memory (SDRAM) comprising:
   a) a memory cell array including a plurality of bit line pairs with each bit line connected to a plurality of memory cells,
   b) a plurality of sense amplifiers with each sense amplifier connected to a bit line pair of said memory cell array through a bank select switch,
   c) a plurality of data line pairs,
   d) a plurality of pass gates with a first pair of pass gates connecting a sense amplifier output of said bit line pair to a first data line pair, and a second pair of pass gates connecting said sense amplifier output of said bit line pair to a second data line pair, whereby each bit line pair is connectable through a sense amplifier to said first and second data line pairs.

2. The SDRAM as defined by claim 1 wherein said first data line pair and said second data line pair are connected alternately to bit line pairs through column select switches.

3. The SDRAM as defined by claim 2 and further comprising a plurality of memory cell arrays, each sense amplifier being connectable to a bit line pair in two memory cell arrays.

4. The SDRAM as defined by claim 3 wherein said plurality of said data line pairs includes two data line pairs.

5. The SDRAM as defined by claim 3 wherein said plurality of said data line pairs includes four data line pairs.

6. The SDRAM as defined by claim 2 wherein said first data line pair and said second data line pair are toggled by alternating column select line signals (CSLA, CSLB).

7. A synchronous dynamic random access memory (SDRAM) comprising:
   a) a plurality of memory cell arrays each including a plurality of bit line pairs with each bit line connected to a plurality of memory cells,
   b) a plurality of sense amplifiers positioned between memory cell arrays with each sense amplifier connected to a bit line pair in two memory cell arrays,
   c) a plurality of data line pairs between each pair of memory cell arrays and running perpendicular to said bit lines,
   d) a plurality of pass gates with a first pair of pass gates connecting a sense amplifier output of said bit line pair to a first data line pair, and a second pair of pass gates connecting said sense amplifier output of said bit line pair to a second data line pair, whereby each bit line pair is connectable through a sense amplifier to said first and second data line pairs.

8. The SDRAM as defined by claim 7 wherein said first data line pair and said second data line pair are toggled alternately in connection to bit line pairs.

9. The SDRAM as defined by claim 8 wherein said plurality of said data line pairs includes two data line pairs.

10. The SDRAM as defined by claim 8 wherein said plurality of said data line pairs includes four data line pairs.

* * * * *